United States Patent [19]

Buchwald, Jr.

[11] Patent Number: 4,617,548
[45] Date of Patent: Oct. 14, 1986

[54] CURRENT SENSING RESISTANCE APPARATUS

[75] Inventor: Paul K. Buchwald, Jr., Margate, Fla.

[73] Assignee: Burroughs Corporation, Detroit, Mich.

[21] Appl. No.: 689,219

[22] Filed: Jan. 7, 1985

[51] Int. Cl.$^4$ .............................................. H01C 1/14
[52] U.S. Cl. ..................... 338/325; 338/279; 338/333; 338/63; 219/541
[58] Field of Search ............... 338/63, 195, 217, 218, 338/240, 279, 280, 283, 295, 322, 325, 326, 328, 330, 333; 219/541, 542, 270

[56] References Cited

U.S. PATENT DOCUMENTS

| | | | |
|---|---|---|---|
| 1,093,968 | 4/1914 | Bicknell | 338/325 |
| 2,994,848 | 8/1961 | Rayburn | 338/328 |
| 3,252,091 | 5/1966 | Morgan | 338/325 X |
| 3,654,580 | 4/1972 | Laisi | 338/61 |
| 3,662,222 | 5/1972 | Ray | 219/270 X |
| 3,680,013 | 7/1972 | Pye | 338/325 X |
| 4,146,868 | 3/1979 | Kiriloff et al. | 338/295 |
| 4,219,797 | 8/1980 | Huang | 338/333 |
| 4,272,739 | 6/1981 | Nesses | 338/325 X |
| 4,292,504 | 9/1981 | Gebarowski et al. | 219/542 |
| 4,475,099 | 10/1984 | Praria | 338/195 |

Primary Examiner—Clarence L. Albritton
Assistant Examiner—M. M. Lateef
Attorney, Agent, or Firm—Carl Fissell, Jr.; Kevin R. Peterson; Edmund M. Chung

[57] ABSTRACT

Current sensing resistance apparatus in the form of a single piece, unitary, U-shaped conductor fabricated from thin flat ribbon material to provide two parallel leg portions terminating in opposite bifurcated ends each pair of which are dissimilarly sized thereby forming electrical circuit connecting elements.

1 Claim, 6 Drawing Figures

CURRENT SENSING RESISTANCE APPARATUS

BACKGROUND OF THE INVENTION

1. Field of the Invention

The present invention relates to resistance devices and more specifically to single component resistances of the unitary type which are simple to manufacture and of extreme accuracy and high tolerance.

2. Description of the Prior Art

In the design of current limiting circuits wherein the current to be limited is sensed by means of the voltage dropped across a known resistance, several problems are encountered by the circuit designers. One such problem is the limited availability of suitable resistance elements to accomplish optimum circuit function at a reasonable cost and in a desired or required small size.

Typically, conventionally available tubular shaped axial leaded wire wound resistors are employed in circuit applications in which the combination of nominal resistance value, resistance tolerance, power dissipation and mounting space are adequate for the purpose.

However, for those applications wherein only a very small or slight variation in resistance value from unit to unit is allowable and wherein nominal resistance value is very small, two terminal resistor elements become impractical due to the fact that the resistance of the device lead wires is a significant portion of the total resistance presented to the circuit by the resistance part.

This problem is usually solved by the employment of so called "KELVIN" type resistors. These resistive devices enable a much more precise current sense function by providing a second pair of leads for circuit interconnection. The secondary leads are connected to the resistive element such that the electrical resistance between these two additional lead connecting points is precisely controllable.

The in-circuit operation of the "KELVIN" resistor is obtained by passing the current to be measured through the entire resistive element which has a relatively imprecise resistance value due to the resistance of the current carrying leads. However, by measuring the voltage drop only across the precise value portion of the resistance, i.e. between the two additional "sense" leads, the resistance of these leads becomes insignificant. This is due to the fact that the "sense" leads do not pass the main input current.

This method of measurement works quite well. However, the components themselves are relatively costly and physically quite large for the function performed. Additionally, if the current sense function is to be applied to a pulsed or AC current of high frequency or fast rise time and/or fall time, then the component becomes even more costly since the inductance of conventional wire-wound resistors becomes prohibitive and the required resistances must be manufactured using the "KELVIN-VARLEY" process.

The "KELVIN VARLEY" technique involves two parallel windings of opposite winding direction in order to cancel most of the inductance which of course increases the cost of the device.

SUMMARY OF THE INVENTION

The present invention solves these and other associated manufacturing and operating problems in a new, novel and heretofore unobvious manner as will now be briefly described.

The suggested resistance element is manufactured by means of a simpler process and from less costly materials than that encountered in the Kelvin Varley process.

A resistive element which exhibits the corresponding desirable characteristics of a "KELVIN VARLEY wound" four terminal resistor can be fabricated in any quantity desired from a flat ribbon or sheet of resistance alloy metal cut, punched or stamped in the shape of a thin elongate strip. The opposite ends of the strip are bifurcated with one leg of each end of the bifurcated strip being larger in planar extent than the other leg of the same strip. The strip thereafter is bent into a U-shape so that the four legs can be electrically interconnected into the desired circuit configuration. This arrangement provides an even more efficient and better performing resistive element than that produced by the "KELVIN VARLEY" process.

DESCRIPTION OF THE PREFERRED EMBODIMENT

Figure 1:
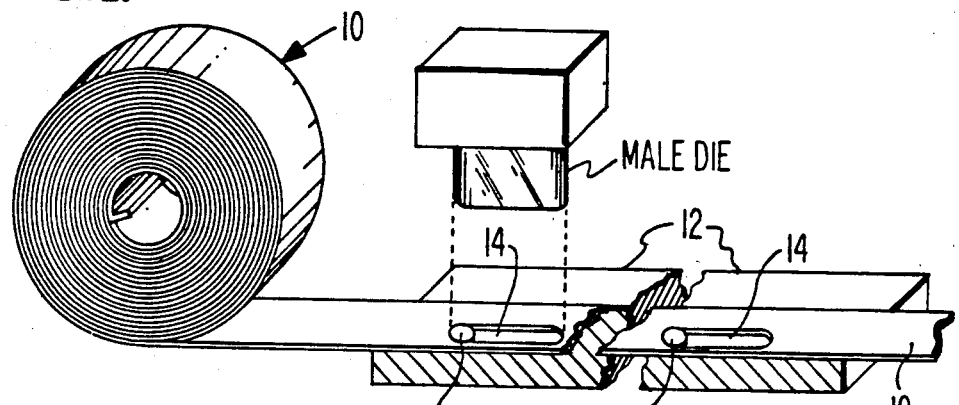
FIG. 1 is a schematic view of a virgin coil of resistive conductor with a portion overlaid on a jig/fixture utilized in preparing the resistive element of the present invention.
Figure 2:
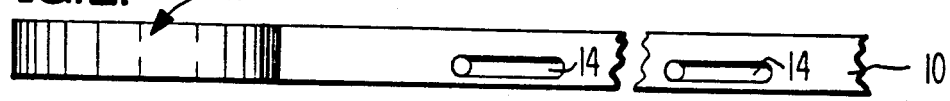
FIG. 2 is a top plan view of the device of FIG. 1.
Figure 3:
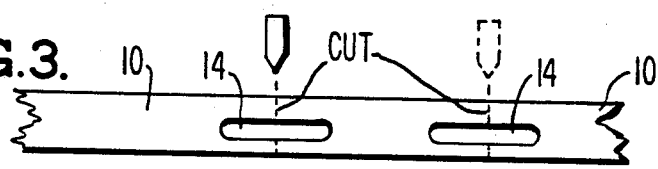
FIG. 3 is a view of the resistive element prior to the final cutting.

The present invention relates to a unitary, individual, single piece resistive element which is capable of acting in the nature of a current limiting device specifically, or as a standard resistive component wherever desired or required.

Material for use in fabricating resistance elements in accordance with the teachings of the present invention can be Cupron TM (trade name for resistance grade constantan) ribbon, manufactured by Wilbur B. Driver Co., 1875 McCarter Highway, Newark, N.J. 07104.

Constantan material composition is 45% nickel and 55% copper with a temperature coefficient of resistance of 0.00002 per °C. over range of 20° C. to 100° C. The material is provided in the form of a thin ribbon 10, 0.250 inches wide by 0.0159 inches thick and, as shown in the drawing figures, is first unraveled from a coil and thereafter flattened on a rigid anvil 12. The anvil includes means for exactly, accurately centering the strip which is provided with a pair of die cut or punched elongated holes 14 0.110 inches wide by 0.625 inches long on a radius of 0.055 inches. The adjacent opposed ends of each pair of holes 14 are separated by 4.138 inches. This latter measurement provides the actual resistive area of the device. The strip 10 is next cut at the center of each elongated hole 14 to produce a flat, elongated strip bifurcated at each end.

It is noted that the leg portions 16 and 18 of each opposite end are dissimilar in width although similar in length. The larger leg 16 of each of the two legs 16 and 18 is 0.016 inches wide, while a smaller or narrower leg 18 of the two legs, is 0.040 inches in width. These two dissimilar width legs ultimately provide interconnecting terminals for the device.

Figure 4:
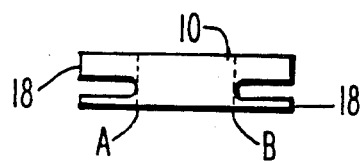
FIG. 4 is a view of the "cut" resistive element.

The resistance of the device is measured across the distance from point A to point B, FIG. 4, i.e. between the inner radii of the openings 14. A resistor fabricated according to the foregoing dimensions or measurements will be nominally 0.020 ohms or twenty milliohms in electrical length from the inner edge of one hole 14 to the inner edge of the opposite hole 14. This measurement corresponds to a physical length of 4.138 inches.

Figure 6:
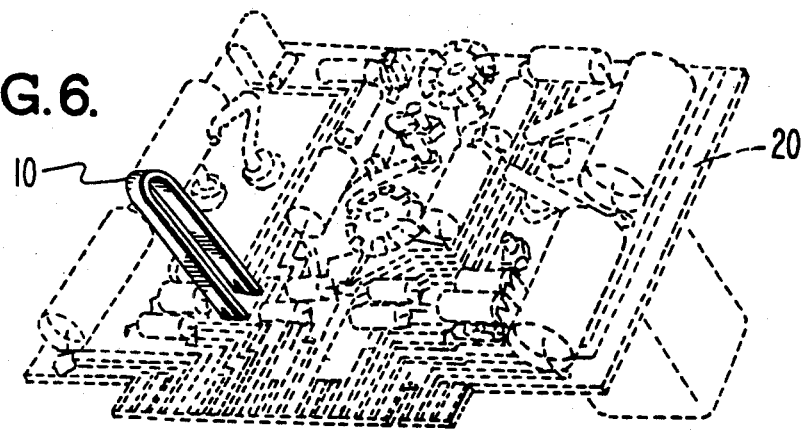
FIG. 6 is a schematic view of a printed circuit board showing the resistive device of the present invention in use.

After the ribbon has been punched with several holes 14, each at the specified distance in accordance with the utilization of the jig/fixture, the individual resistors may be separated from the remaining strip material by the simple expedient of cutting through the ribbon at the approximately longitudinal center of the hole, as aforementioned. The separating cut need not be extremely precise and, in fact, so long as there remains sufficient lead to penetrate a printed wiring board 20, FIG. 6, on which the part is to be installed, the part will function as required.

Figure 5:
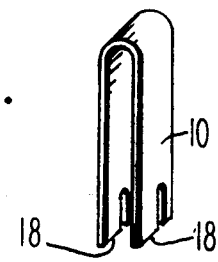
FIG. 5 is a view of the resistive element as bent into a U-shape for use in electrical circuit.

The completed resistance device 22, bent into a U-shape is shown in FIG. 5. Resistance 22 is employed in a conventional printed wiring board 20 by inserting the legs 16 and 18 in respective conductive plated through openings (not shown) in the board. The contact legs 16–18 are thereafter soldered in place completing the electrical circuit interconnection on the board 20.

What is claimed is:

1. Current sensing resistance apparatus comprising:
a thin conductive ribbon having a length greater than its width and comprises of resistance grade conductive material,
said ribbon terminating at each opposite end in a longitudinal bifurcation forming individual pairs of input-output terminals respectively, wherein one terminal of each pair of terminals being disproportinately larger than the other terminal of each pair, and
said ribbon being formed into parallel portions effective to permit said terminals to be interconnected into associated operative electrical circuitry with which the device is utilized.

* * * * *